United States Patent
Stolz et al.

[11] Patent Number: 6,075,802
[45] Date of Patent: Jun. 13, 2000

[54] LATERAL CONFINEMENT LASER

[75] Inventors: Björn Stolz; Ulf Öhlander, both of Stockholm, Sweden

[73] Assignee: Telefonaktiebolaget L, Ericsson, Stockholm, Sweden

[21] Appl. No.: 09/038,980

[22] Filed: Mar. 12, 1998

[51] Int. Cl.[7] .................................................. H01S 3/19
[52] U.S. Cl. .............................. 372/46; 372/45; 372/43
[58] Field of Search ................... 372/42–48, 50

[56] References Cited

U.S. PATENT DOCUMENTS

| | | | |
|---|---|---|---|
| 5,227,015 | 7/1993 | Fujihara et al. | 156/647 |
| 5,245,622 | 9/1993 | Jewell et al. | 372/45 |
| 5,260,230 | 11/1993 | Kondo | 437/129 |
| 5,398,255 | 3/1995 | Terakado | 372/46 |
| 5,452,315 | 9/1995 | Kimura et al. | 372/46 |
| 5,470,785 | 11/1995 | Kondo | 437/129 |
| 5,751,756 | 5/1998 | Takayama et al. | 372/46 |
| 5,825,796 | 10/1998 | Jewell et al. | 372/45 |
| 5,903,588 | 5/1999 | Guenter et al. | 372/46 |

FOREIGN PATENT DOCUMENTS 0 798 832 A2   10/1997   European Pat. Off. .

Primary Examiner—Rodney Bovernick
Assistant Examiner—Juliana K. Kang
Attorney, Agent, or Firm—Nixon & Vanderhye P.C.

[57] ABSTRACT

In a semiconductor laser comprising a mesa structure (11), the lateral current distribution in the mesa structure (11) is controlled in order to reduce the current at the mesa walls near the active lasing layer (15) by locating, in the mesa structure, a current blocking layer (13) having an aperture (14) of less width than the mesa structure (11) and being centred in relation to the mesa structure (11).

2 Claims, 1 Drawing Sheet

LATERAL CONFINEMENT LASER

TECHNICAL FIELD

The invention relates generally to lasers and more particularly to an improvement of the lateral confinement in a semiconductor laser.

BACKGROUND OF THE INVENTION

Semiconductor lasers which provide lateral confinement for the injection current are well know. Buried waveguide, also known as buried heterostructure, semiconductor lasers are e.g. well known per se, i.a. from U.S. Pat. No. 5,277,015, U.S. Pat. No. 5,260,230, U.S. Pat. No. 5,398,255, U.S. Pat. No. 5,452,315, and U.S. Pat. No. 5,470,785. Both ridge waveguide and buried waveguide lasers are known to yield lateral control of electrical and optical confinement.

By lateral direction, a direction perpendicular to the direction of epitaxial growth, is to be understood. For VCSELs (Vertical Cavity Surface Emitting Lasers), the lateral direction may denote all directions in the plane perpendicular to the growth direction. For EELs (Edge Emitting Lasers), the lateral direction is usually perpendicular to the direction of propagation of lasing light. Furthermore, electrical lateral confinement denotes the control of spread of injection current in the lateral direction, while optical lateral confinement denotes the waeguide lateral control of the lasing light.

For ridge waveguide lasers, a ridge (or mesa) is formed above the active region, where the active region in the vicinity of lasing action, is not constricted in the lateral direction. The electrical lateral confinement is achieved by the finite spread of injection current in the active layer, due to the finite width of the above ridge The optical lateral confinement is obtained by the waveguiding due to the ridge. For buried waveguide lasers, the active layer is laterally constructed by (i.e. included in) the mesa. The mesa is epitaxially buried in order to avoid deteriorated performance caused by crystal imperfections in the vicinity of the active lasing regions. The electrical and optical lateral confinement, respectively, is obtained by the difference between active and burying material, in band offset and refractive index, respectively.

However, for ordinary ridge and buried waveguide lasers, both electrical and optical lateral confinement are controlled with the same design parameters, i.e. physical dimensions and material of the mesa, active layer and burying material.

SUMMARY OF THE INVENTION

The object of the invention is to improve the control of lateral confinement of the respective electrical and optical properties, by substantially decoupling the control parameters.

This is obtained by including in the mesa, one or several layers which substantially laterally blocks the current while not substantially changing the lateral waveguiding of the lasing light.

Hereby, the threshold current and/or the total drive current of the laser will decrease. Moreover, the lifetime of the laser will increase. For a ridge laser, e.g. less current is lost in the active region where lasing does not occur, while for a buried laser, the current near the mesa side walls, which are typical centres for recombination and degradation, will decrease.

Thus, in accordance with the invention, lasers with better performance e.g. lower threshold current, higher injection efficiency, higher output power, better spectral control and improved long-term reliability will be obtained.

BRIEF DESCRIPTION OF THE DRAWING

The invention will be described more in detail below with reference to the appended drawings, on which

PREFERRED EXAMPLE EMBODIMENTS

Figure 1:
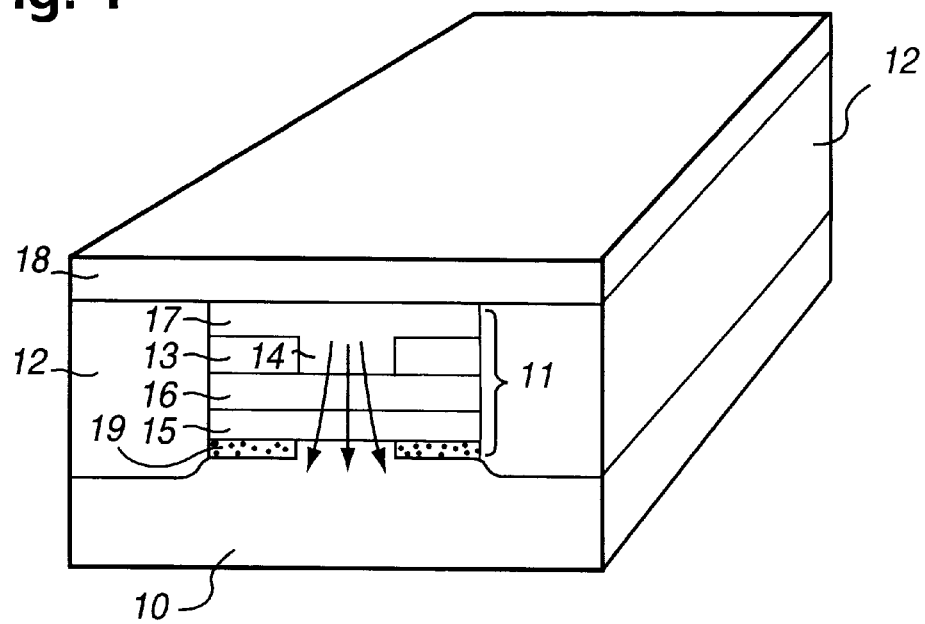
FIG. 1 is a perspective view of an embodiment of a buried waveguide laser according to the invention.

FIG. 1 is a perspective view of an embodiment of a buried waveguide semiconductor laser according to the invention. In a manner known per se, the laser comprises of a substrate 10, a mesa structure 11 buried in a current block layer 12. In accordance with the invention, to control the lateral current distribution in the mesa structure 11 in order to reduce the current along the walls of the mesa structure 11, a current blocking layer 13 having an aperture 14 of less width than the mesa structure 11, is located with its aperture 14, substantially centred in relation to the mesa structure 11.

In the mesa structure 11 according to FIG. 1, the current blocking layer 13 having the aperture 14, is separated from an underlying active layer 15 by a spacer layer 16, and a cladding layer 17 is provided on top of he current blocking layer 13. In this embodiment, the cladding layer 17 also fills out the aperture 14 in the current blocking layer 13. A contact layer 18 is provided on top of the mesa structure 11 and the current blocking layer 12. In the embodiment according to FIG. 1, the current blocking layer 13 having the aperture 14, is located in the mesa structure 11 above the active layer 15.

It is to be understood that for buried waveguide lasers, the apertured current blocking layer equally well can be located below the active layer in the mesa structure. In fact, one apertured current blocking layer 13 may be located above the active layer, while another apertured current blocking layer 19 may be located below the active layer.

As stated above, the current blocking layer 13 having the aperture 14, is provided to reduce the current at the mesa walls in a controlled manner. By means of the aperture 14 in the current blocking layer 13, charge carrier transport is forced to be substantially laterally confined within the aperture 14 as indicated by means of arrows in FIG. 1. After passing the aperture 14, the charge carriers spread to the active layer 15, where they recombine with charge carriers of opposite polarity. Due to he current blocking portions of the layer 13, extending partly across the active layer 15, the current along the walls of the mesa structure 11 will be reduced. Hereby, the threshold and/or drive current will be reduced and/or the reliability of the laser will increase.

Figure 2:
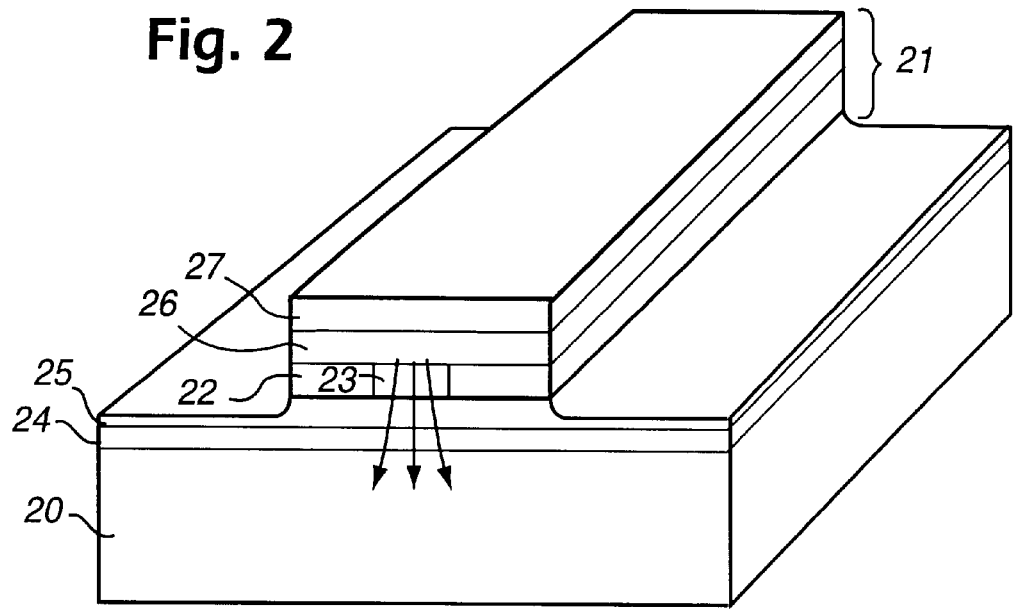
FIG. 2 is a perspective view of an embodiment of a ridge waveguide laser according to the invention.

FIG. 2 is a perspective view of an embodiment of a ridge waveguide semiconductor laser according to the invention. As in FIG. 1, the laser in FIG. 2 comprises on a substrate 20, an active layer 24 and a mesa structure 21 in a manner known per se.

In the embodiment in FIG. 2, the control of lateral current distribution in the active layer 24 is improved by defining its lateral spread in the mesa structure 21 in accordance with the invention by a current blocking layer 22 having an aperture 23 of less width than the mesa structure 21. The current blocking layer 22 is located with its aperture 23 substantially centred in relation to the mesa structure 21.

In FIG. 2, the current blocking layer 22 having the aperture 23, is separated from the underlying active layer 24 by a spacer layer 25. A cladding layer 26 is provided on top of the current blocking layer 22. In this embodiment in FIG.

2, the cladding layer 26 also fills out the aperture 23 in the current blocking layer 22. A contact layer 27 is provided on top of the mesa structure 21. Also in the embodiment according to FIG. 2, the charge carrier transport is forced by the current blocking portions of the layer 22 to be substantially laterally confined within the aperture 23 as indicated by means of arrows in FIG. 2.

Thus, in the embodiment according to FIG. 1, the current blocking layer 13 having the aperture 14 is located in a mesa structure 11, while similarly in the embodiment according to FIG. 2, the current blocking layer 22 having the aperture 23, is located in the mesa structure 21. In both embodiments illustrated, the current along the mesa walls will be reduced in comparison with known buried and ridge waveguide lasers.

What is claimed is:

1. A buried waveguide semiconductor laser with a mesa structure comprising:

an active laser layer;

two current blocking layers both having an aperture of less width than the mesa structure located within the mesa structure with the aperture substantially centered in relation to the mesa structure, wherein one current blocking layer is located above the active laser layer, and the other current blocking layer is located below the active laser layer.

2. The laser according to claim 1, wherein at least one spacer layer is located between an active layer and one of the two current blocking layers.

* * * * *